United States Patent
Lin et al.

(10) Patent No.: US 11,953,523 B2
(45) Date of Patent: Apr. 9, 2024

(54) AFE CIRCUIT AND RELATED GAIN AMPLIFIER

(71) Applicant: NOVATEK Microelectronics Corp., Hsin-Chu (TW)

(72) Inventors: Tzu-Wei Lin, Hsinchu County (TW); Hung-Kai Chen, Taipei (TW); Feng-Lin Chan, Hsinchu County (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 246 days.

(21) Appl. No.: 17/539,170

(22) Filed: Nov. 30, 2021

(65) Prior Publication Data
US 2023/0168282 A1    Jun. 1, 2023

(51) Int. Cl.
*G01R 1/30*    (2006.01)
*H03G 3/30*    (2006.01)

(52) U.S. Cl.
CPC .................. *G01R 1/30* (2013.01); *H03G 3/30* (2013.01); *H03G 2201/103* (2013.01)

(58) Field of Classification Search
CPC ...... G01R 1/30; H03G 3/30; H03G 2201/103; G06F 13/287; G06F 5/16
See application file for complete search history.

(56) References Cited

U.S. PATENT DOCUMENTS

2013/0120178 A1    5/2013    Murakami
2021/0313401 A1*   10/2021   Lee ..................... H10K 50/844

* cited by examiner

*Primary Examiner* — Son T Le
(74) *Attorney, Agent, or Firm* — Winston Hsu

(57) ABSTRACT

An analog front-end (AFE) circuit, configured to be coupled to a sensor having a plurality of sensing units, includes a plurality of sensing circuits and a plurality of multiplexers. Each of the plurality of multiplexers is coupled between one of the plurality of sensing units and at least two of the plurality of sensing circuits.

15 Claims, 12 Drawing Sheets

AFE CIRCUIT AND RELATED GAIN AMPLIFIER

BACKGROUND OF THE INVENTION

1. Field of the Invention

The present invention relates to an analog front-end (AFE) circuit and a gain amplifier, and more particularly, to an AFE circuit and a gain amplifier used for a sensor.

2. Description of the Prior Art

Sensors are widely used in various electronic products, for performing sensing operations such as capacitive sensing, resistive sensing, optical sensing, and ultrasonic sensing. Such a sensor may be a touch sensor, fingerprint sensor, photo sensor, or the like. The sensor may perform sensing to generate sensing signals, which are received by a readout circuit for subsequent processing. In general, the sensor may include a plurality of sensing units, and the readout circuit may include a plurality of channels, each corresponding to one of the sensing units. The sensing signals generated from a sensing unit will be forwarded to the corresponding channel of the readout circuit.

However, the sensing signals received by the readout circuit may have an offset, which is usually resulting from the mismatch (e.g., process mismatch) of the sensing units in the sensor and/or the mismatch (e.g., process mismatch) of the circuits in the channels of the readout circuit. For example, if the sensor is an in-display fingerprint sensor or touch sensor integrated with a display panel, the sensor will have a large area and a great number of sensing units under a large-scale panel. There will be non-negligible offset between the sensing units. Also, the large sensor should be dealt with by a large readout circuit having a great number of channels; hence, the mismatch between the circuits in these channels may also generate a larger offset.

The prior art usually cancels the offset by using calibration, where a predetermined compensation signal may be applied to compensate for the offset in the processing circuit for the sensing signals. However, in several applications, the sensing signals may be applied with variable gains; that is, the gain magnitude applied to the sensing signal may dynamically change. It is not easy to perform compensation on the sensing signals under a dynamically changing gain since the fixed compensation value is not suitable for compensating for the sensing signal with a variable gain, and the value of the compensation signal under variable gain cannot be determined easily. Thus, there is a need for improvement over the prior art.

SUMMARY OF THE INVENTION

It is therefore an objective of the present invention to provide a novel readout circuit which can reduce or cancel the influences resulting from the offset due to the process mismatch, in order to solve the abovementioned problems.

An embodiment of the present invention discloses an analog front-end (AFE) circuit, which is configured to be coupled to a sensor having a plurality of sensing units. The AFE circuit comprises a plurality of sensing circuits and a plurality of multiplexers. Each of the plurality of multiplexers is coupled between one of the plurality of sensing units and at least two of the plurality of sensing circuits.

Another embodiment of the present invention discloses a gain amplifier of an AFE circuit. The gain amplifier comprises a plurality of output elements and a plurality of switches. Each of the plurality of switches is coupled to one of the plurality of output elements. Wherein, the plurality of output elements are configured to generate a first gain under a first configuration of the plurality of switches and generate a second gain under a second configuration of the plurality of switches; and wherein, the first gain is substantially equal to the second gain, and the first configuration is different from the second configuration.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
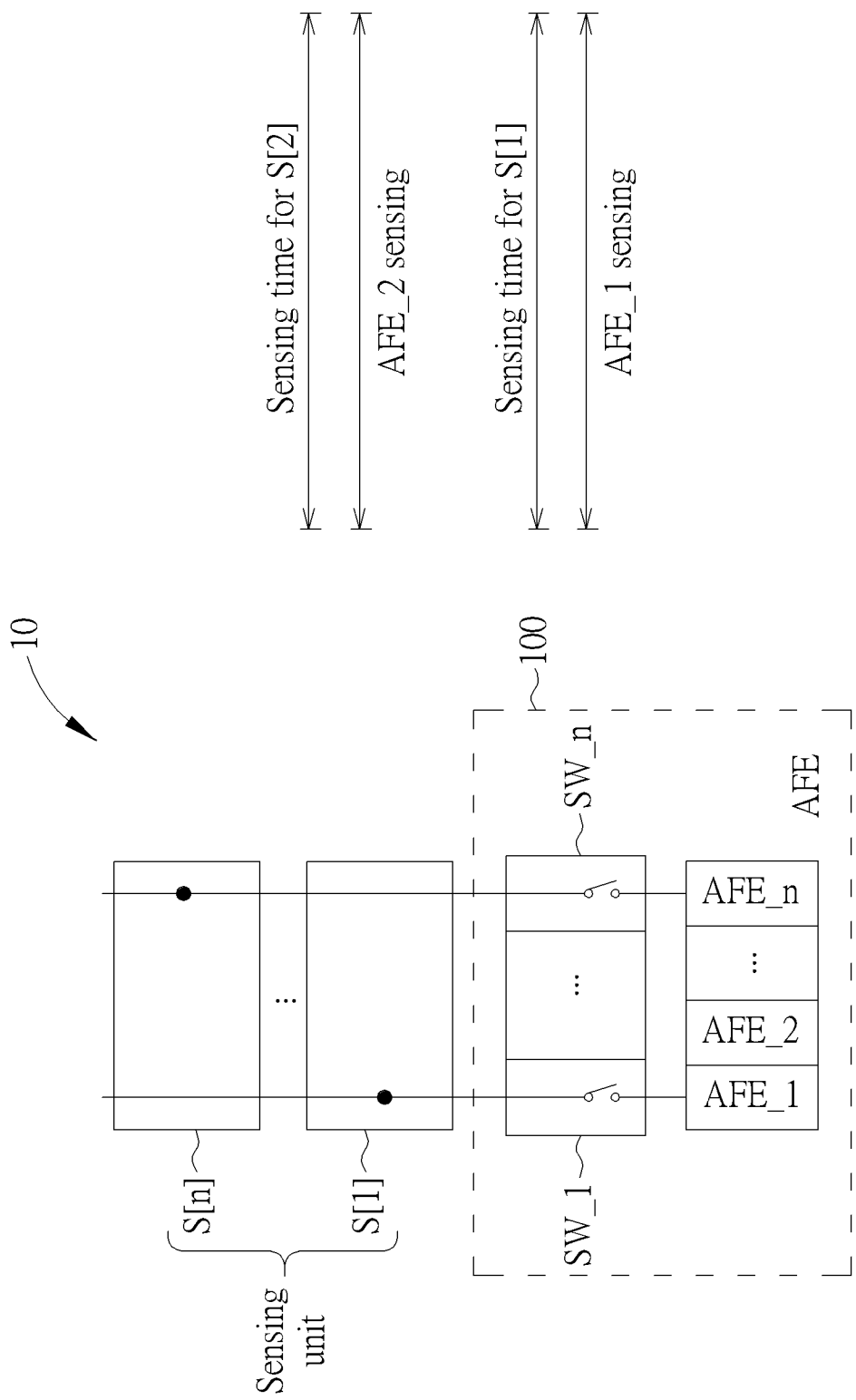
FIG. 1 is a schematic diagram of a general sensing system.

Please refer to FIG. 1, which is a schematic diagram of a general sensing system 10. As shown in FIG. 1, the sensing system 10 includes a plurality of sensing units S[1]-S[n] and an analog front-end (AFE) circuit 100. Each of the sensing units S[1]-S[n] may be an area on a sensor capable of performing sensing to generate sensing signals. The AFE circuit 100, which may be considered as a readout circuit for the sensing units S[1]-S[n], includes switches SW_1-SW_n and sensing circuits AFE_1-AFE_n. Each of the switches SW_1-SW_n and each of the sensing circuits AFE_1-AFE_n are allocated in a channel of the AFE circuit 100, for reading out or receiving the sensing signals from one of the sensing units S[1]-S[n]. In this example, each sensing circuit AFE_1-AFE_n corresponds to one sensing unit S[1]-S[n] in a one-to-one mapping.

In detail, during the sensing time for the sensing unit S[1], the switch SW_1 is turned on and the sensing circuit AFE_1 receives the sensing signals from the sensing unit S[1]; during the sensing time for the sensing unit S[2], the switch SW_2 is turned on and the sensing circuit AFE_2 receives the sensing signals from the sensing unit S[2]; and so on. The sensing time for the sensing unit S[1] and the sensing time for the sensing unit S[2] may overlap each other or not. In such a situation, the sensing signals generated from one sensing unit are always received by the same sensing circuit, which easily suffers from the process mismatch of the sensing circuit, especially when there are a great number of sensing circuits and channels in the AFE circuit 100. Further, if the sensing circuit needs to apply a variable gain to the sensing signals, the output of the sensing signals will possess different magnitudes of offsets, which cannot be canceled by a predetermined compensation value. More specifically, the compensation value cannot dynamically change to be adapted to the gain of the received sensing signals.

Figure 2:
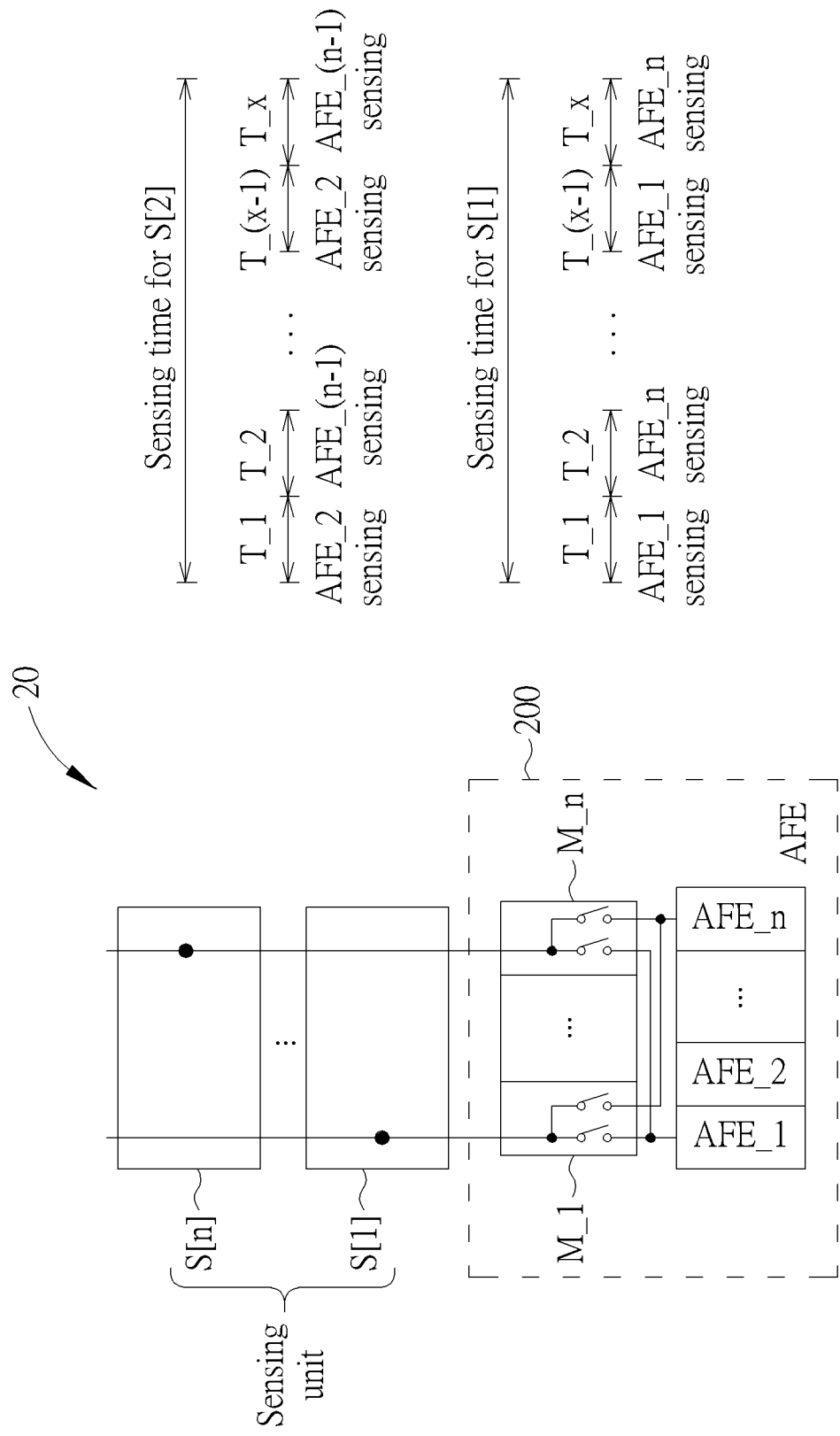
FIG. 2 is a schematic diagram of a sensing system according to an embodiment of the present invention.

Please refer to FIG. 2, which is a schematic diagram of a sensing system 20 according to an embodiment of the present invention. As shown in FIG. 2, the sensing system 20 includes a plurality of sensing units S[1]-S[n] and an AFE circuit 200. Each of the sensing units S[1]-S[n] may be an area on a sensor capable of performing sensing to generate sensing signals. The sensor containing the sensing units S[1]-S[n] may be, but not limited to, a touch sensor, fingerprint sensor, photo sensor, or any other type of sensor device. For example, if the sensor is a capacitive touch sensor, each of the sensing units S[1]-S[n] may be a touch area consisting of a touch sensing electrode or touch pad, or may be a row or column of similar touch sensing electrodes. If the sensor is an optical image sensor (e.g., optical fingerprint sensor), each of the sensing units S[1]-S[n] may be a sensing pixel consisting of a photodiode and several transistors, or may be a group, row, or column of similar sensing pixels.

The AFE circuit 200, which may be regarded as a readout circuit for the sensing units S[1]-S[n], includes multiplexers (MUXs) M_1-M_n and sensing circuits AFE_1-AFE_n. In general, the AFE circuit 200 may further be coupled to an analog-to-digital converter (ADC) and a digital processing circuit, which are omitted herein for brevity.

Different from the AFE circuit 100 where each sensing circuit AFE_1-AFE_n corresponds to one of the sensing units S[1]-S[n] in a one-to-one mapping, in the AFE circuit 200, each of the MUXs M_1-M_n is coupled between one of the sensing units S[1]-S[n] and at least two of the sensing circuits AFE_1-AFE_n. Therefore, each of the MUXs M_1-M_n may be used to selectively couple the corresponding sensing unit S[1]-S[n] to one of the at least two of the sensing circuits AFE_1-AFE_n. In such a situation, the sensing signals generated from each of the sensing units S[1]-S[n] may be received and processed by at least two different sensing circuits in different channels among the sensing circuits AFE_1-AFE_n.

In this embodiment, based on the connections of the MUX M_1, the MUX M_1 may selectively couple the sensing unit S[1] to one of the sensing circuits AFE_1 and AFE_n. The MUX M_1 includes a first switch coupled between the sensing unit S[1] and the sensing circuit AFE_1 and a second switch coupled between the sensing unit S[1] and the sensing circuit AFE_n, allowing the sensing unit S[1] to be coupled to the sensing circuit AFE_1 or AFE_n selectively. As shown in FIG. 2, the sensing unit S[1] may be coupled to the sensing circuits AFE_1 and AFE_n alternately. In detail, the sensing time for the sensing unit S[1] may be divided into multiple time slots T_1-T_x, where x is an integer greater than 1. In this embodiment, x is an even integer. In the odd time slots T_1, T_3 . . . , and T_(x-1), the first switch is turned on and the second switch is turned off; hence, the sensing unit S[1] is coupled to the sensing circuit AFE_1, and the sensing signal of the sensing unit S[1] is received by the sensing circuit AFE_1. In the even time slots T_2, T_4", and T_x, the first switch is turned off and the second switch is turned on; hence, the sensing unit S[1] is coupled to the sensing circuit AFE_n, and the sensing signal of the sensing unit S[1] is received by the sensing circuit AFE_n.

Therefore, in the AFE circuit 200, the sensing signals from the sensing unit S[1] are received by the sensing circuits AFE_1 and AFE_n alternately; hence, the influence caused by the offset of the sensing circuits may be reduced or canceled. Considering the offset in the frequency domain, suppose that the sensing circuits AFE_1 and AFE_n have different offset values, which means that the offset magnitude may change between every two consecutive time slots. The offset may generate distortion on the output signals of the sensing circuits AFE_1 and AFE_n when a gain of the sensing circuits AFE_1 and AFE_n varies dynamically. Since the offset values of the sensing circuits AFE_1 and AFE_n are usually different, different channels corresponding to the sensing circuits AFE_1 and AFE_n may have different harmonics in the spectrum. Therefore, the energies of the harmonics will be shifted to a higher frequency by switching between different sensing circuits AFE_1 and AFE_n, while the energies of the sensing signal remain in the lower frequency corresponding to the length of the overall sensing time for one sensing unit. In such a situation, the influences on the sensing signal caused by the offset may be mitigated.

Considering the offset in the time domain, the sensing signals may be received with different offset magnitudes in different time slots T_1-T_x of the sensing time. Therefore, the AFE circuit 200 may receive the sensing signals from a specific sensing unit through multiple sensing circuits in the time slots T_1-T_x. For example, as shown in FIG. 2, the sensing signals of the sensing unit S[1] are received by the sensing circuits AFE_1 and AFE_n alternately. These sensing signals received by different sensing circuits are averaged to generate a sensing result corresponding to the specific sensing unit. In such a situation, the influences on the sensing signal caused by the offset may be mitigated after the average operation.

Moreover, the method of receiving the sensing signals of a sensing unit through multiple sensing circuits may deal with the offset when a variable gain is applied to the sensing signals. If a variable gain is used, the offset may also undergo a variable amplification ratio. Since the offsets generated from different channels or different sensing circuits are amplified with different gains randomly, the overall offset may still be reduced if the number of sensing circuits used to receive the sensing signal and the number of time slots allocated to the sensing circuits are large enough. In such a situation, the influences of the offset may be canceled effectively after an average of the sensing signal received from different sensing circuits.

Similarly, based on the connections of the MUX M_n, the MUX M_n may selectively couple the sensing unit S[n] to one of the sensing circuits AFE_1 and AFE_n. More specifically, the sensing unit S[n] is coupled to the sensing circuits AFE_1 and AFE_n in different time slots T_1-T_x, respectively. In this embodiment, in the odd time slots T_1, T_3 . . . , and T (x-1) where the sensing unit S[1] is coupled to the sensing circuit AFE_1, the sensing unit S[n] is coupled to the sensing circuit AFE_n; and in the even time slots T_2, T_4 . . . , and T_x where the sensing unit S[1] is coupled to the sensing circuit AFE_n, the sensing unit S[n] is coupled to the sensing circuit AFE_1.

In addition, each of the sensing units S[2] and S[n-1] may be selectively coupled to one of the sensing circuits AFE_2 and AFE_(n-1) in each time slot T_1-T_x. The MUX M_2 may selectively couple the sensing unit S[2] to the sensing circuits AFE_2 and AFE_(n-1) in different time slots, allowing the sensing signals of the sensing unit S[2] to be received by the sensing circuits AFE_2 and AFE_(n-1) alternately. The MUX M_(n-1) may selectively couple the sensing unit S[n-1] to the sensing circuits AFE_2 and AFE_(n-1) in different time slots, allowing the sensing signals of the sensing unit S[n-1] to be received by the sensing circuits AFE_2 and AFE_(n-1) alternately. In similar manners, every two sensing units may be considered as a group for sharing the same sensing circuits in a time division manner, so as to reduce or cancel the influence of the offset between the sensing circuits.

In another embodiment, three or more sensing units may be considered as a group, and the MUX may be correspondingly deployed. For example, a MUX corresponding to a sensing unit may include three or more switches, allowing the sensing unit to be coupled to three or more sensing circuits in different channels indifferent time slots. In such a situation, the sensing signals of the sensing unit may be received by these sensing circuits, and the influence of the offset between these sensing circuits may be reduced. The usage of more sensing circuits for one sensing unit may reduce the influence caused by the offset more effectively, but it is accompanied by a higher hardware cost generated from more switch elements and complex wire connections. In one embodiment, each sensing unit may be selectively and dynamically coupled to each of the sensing circuits, and the sensing signals may be received by different sensing circuits in the time slots; hence, the influences caused by the offset between the sensing circuits may be minimized.

Figure 3:
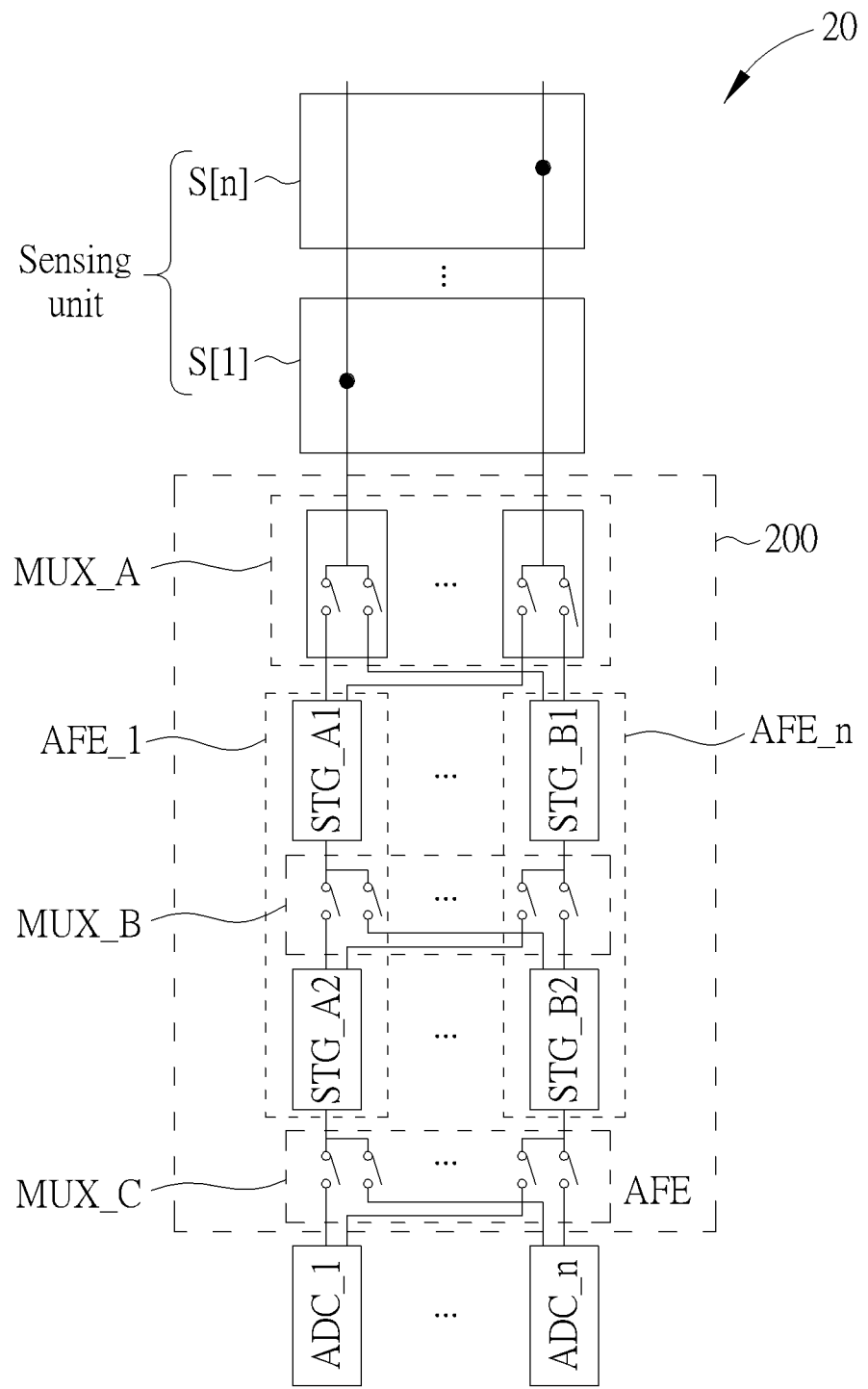
FIG. 3 is a schematic diagram of the sensing system with a detailed implementation of the AFE circuit.

Please refer to FIG. 3, which is a schematic diagram of the sensing system 20 with a detailed implementation of the AFE circuit 200. As shown in FIG. 3, the AFE circuit 200 includes the sensing circuits AFE_1-AFE_n and the MUXs MUX_A, MUX_B and MUX_C. The AFE circuit 200 is further coupled to one or more ADCs ADC_1-ADC_n, and the sensing signals received by the sensing circuits AFE_1-AFE_n are processed and then output to the ADCs ADC_1-ADC_n, to be converted into digital data. Each sensing circuit may be in a channel and include several circuit stages. For example, the sensing circuit AFE_1 is in a channel and includes a first stage STG_A1 and a second stage STG_A2. The sensing circuit AFE_n is in another channel and includes a first stage STG_B1 and a second stage STG_B2. In general, the first stage may be a sampling stage for sampling the sensing signals and converting the received sensing signals into a voltage domain, and the second stage may be an amplification stage for amplifying the sensing signals, but those skilled in the art should understand that the implementations are not limited thereto.

There are three MUXs MUX_A, MUX_B and MUX_C included in the AFE circuit 200. The MUX MUX_A is coupled between the sensing units S[1] and S[n] and the first stage STG_A1 of the sensing circuit AFE_1 and the first stage STG_B1 of the sensing circuit AFE_n. The MUX MUX_B is coupled between the first stage STG_A1 of the sensing circuit AFE_1, the first stage STG_B1 of the sensing circuit AFE_n, the second stage STG_A2 of the sensing circuit AFE_1, and the second stage STG_B2 of the sensing circuit AFE_n. The MUX MUX_C is coupled between the second stage STG_A2 of the sensing circuit AFE_1, the second stage STG_B2 of the sensing circuit AFE_N, and the ADCs ADC_1 and ADC_n.

FIGS. 4A-4D illustrate the implementations of the AFE circuit 200 that apply different sensing circuits to receive and process the sensing signals of the same sensing unit.

Figure 4A:
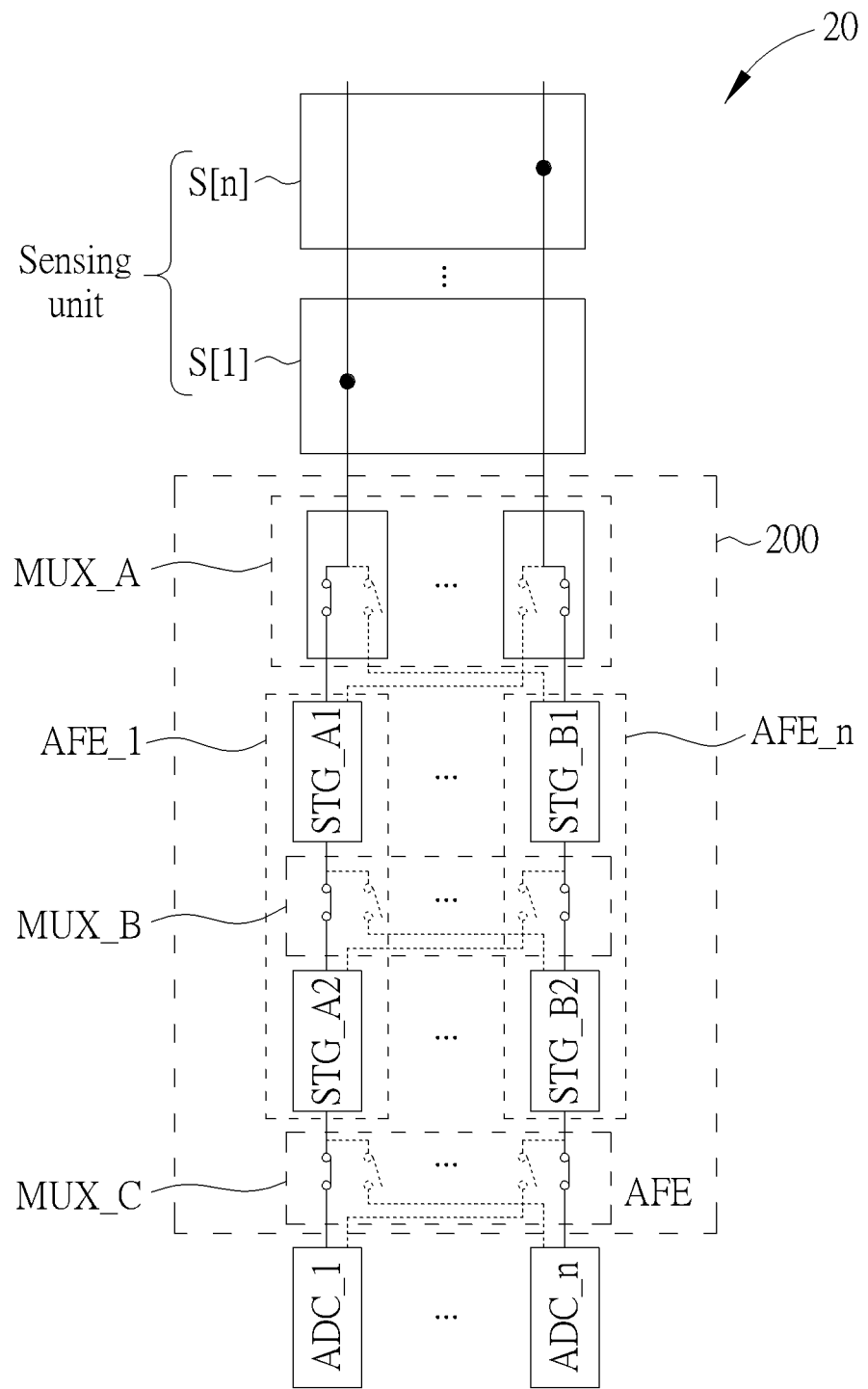
FIGS. 4A-4D illustrate the implementations of the AFE circuit that apply different sensing circuits to receive and process the sensing signals of the same sensing unit.

As shown in FIG. 4A, the MUX MUX_A is configured to couple the sensing unit S[1] to the first stage STG_A1 of the sensing circuit AFE_1 and couple the sensing unit S[n] to the first stage STG_B1 of the sensing circuit AFE_n. The MUX MUX_B is configured to couple the first stage STG_A1 of the sensing circuit AFE_1 and couple the first stage STG_B1 of the sensing circuit AFE_n to the second stage STG_B2 of the sensing circuit AFE_n. The MUX MUX_C is configured to couple the second stage STG_A2 of the sensing circuit AFE_1 to the ADC ADC_1 and couple the second stage STG_B2 of the sensing circuit AFE_n to the ADC ADC_n. In this configuration, the sensing signal from the sensing unit S[1] may be received and processed by the first stage STG_A1 and the second stage STG_A2 of the sensing circuit AFE_1 and then output to the ADC ADC_1, and the sensing signal from the sensing unit S[n] may be received and processed by the first stage STG_B1 and the second stage STG_B2 of the sensing circuit AFE_n and then output to the ADC ADC_n.

Figure 4B:
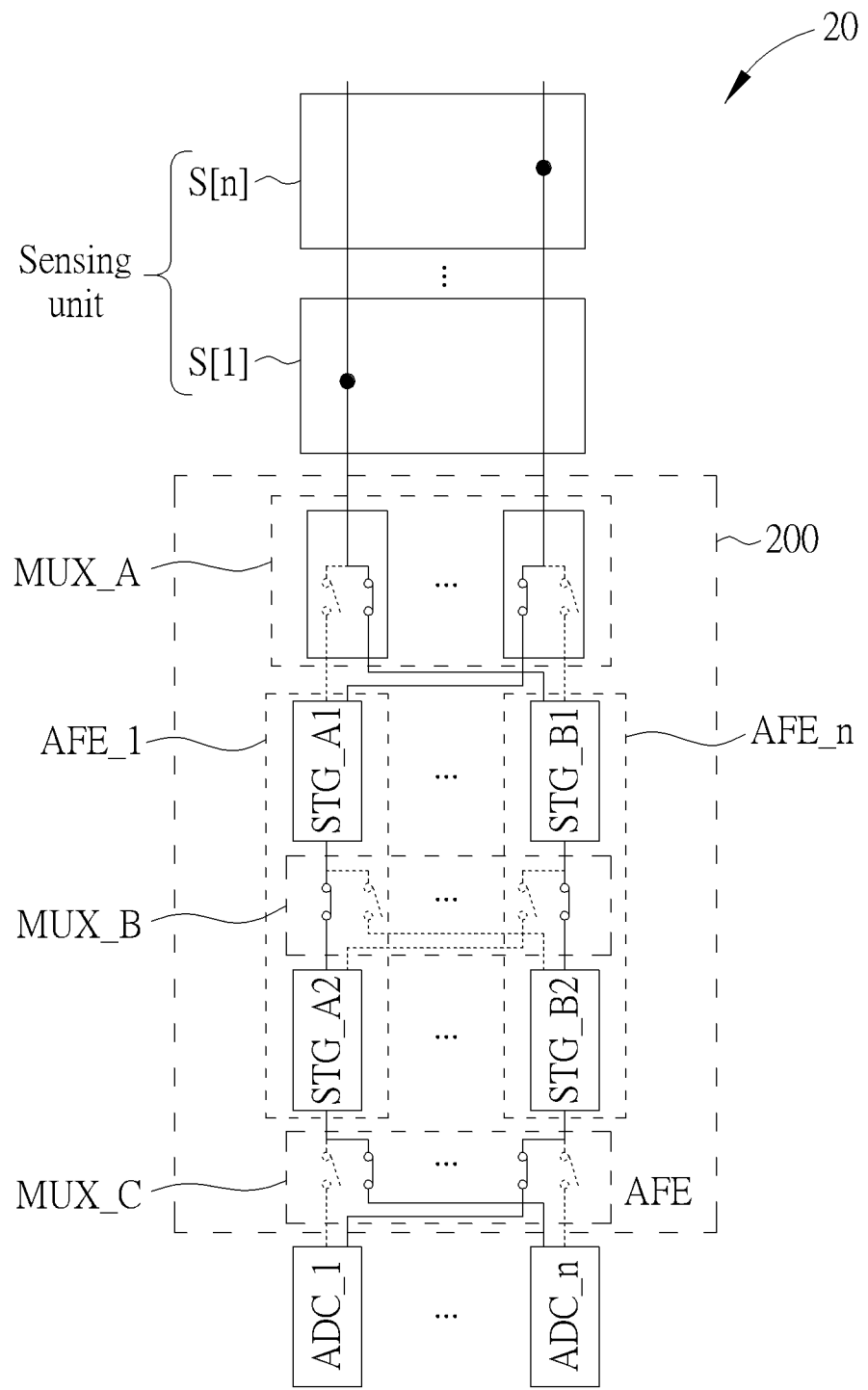

As shown in FIG. 4B, the MUX MUX_A is configured to couple the sensing unit S[1] to the first stage STG_B1 of the sensing circuit AFE_n and couple the sensing unit S[n] to the first stage STG_A1 of the sensing circuit AFE_1. The MUX MUX_B is configured to couple the first stage STG_B1 of the sensing circuit AFE_n to the second stage STG_B2 of the sensing circuit AFE_n and couple the first stage STG_A1 of the sensing circuit AFE_1 to the second stage STG_A2 of the sensing circuit AFE_1. The MUX MUX_C is configured to couple the second stage STG_B2 of the sensing circuit AFE_n to the ADC ADC_1 and couple the second stage STG_A2 of the sensing circuit AFE_1 to the ADC ADC_n. In this configuration, the sensing signal from the sensing unit S[1] may be received and processed by the first stage STG_B1 and the second stage STG_B2 of the sensing circuit AFE_n and then output to the ADC ADC_1, and the sensing signal from the sensing unit S[n] may be received and processed by the first stage STG_A1 and the second stage STG_A2 of the sensing circuit AFE_1 and then output to the ADC ADC_n.

As mentioned above, the sensing time for each sensing unit may be divided into multiple time slots T_1-T_x. In an embodiment, the configurations of MUXs as shown in FIGS. 4A and 4B may be switched alternately. For example, the MUX configuration shown in FIG. 4A may be applied in the odd time slots T_1, T_3 . . . , and T (x-1), and the MUX configuration shown in FIG. 4B may be applied in the even time slots T_2, T_4 . . . , and T_x. As a result, the sensing signals from any one of the sensing units S[1] and S[n] may be dynamically received and processed by different sensing circuits in different channels, so as to reduce the overall offset magnitude resulting from the AFE circuit 200.

Figure 4C:
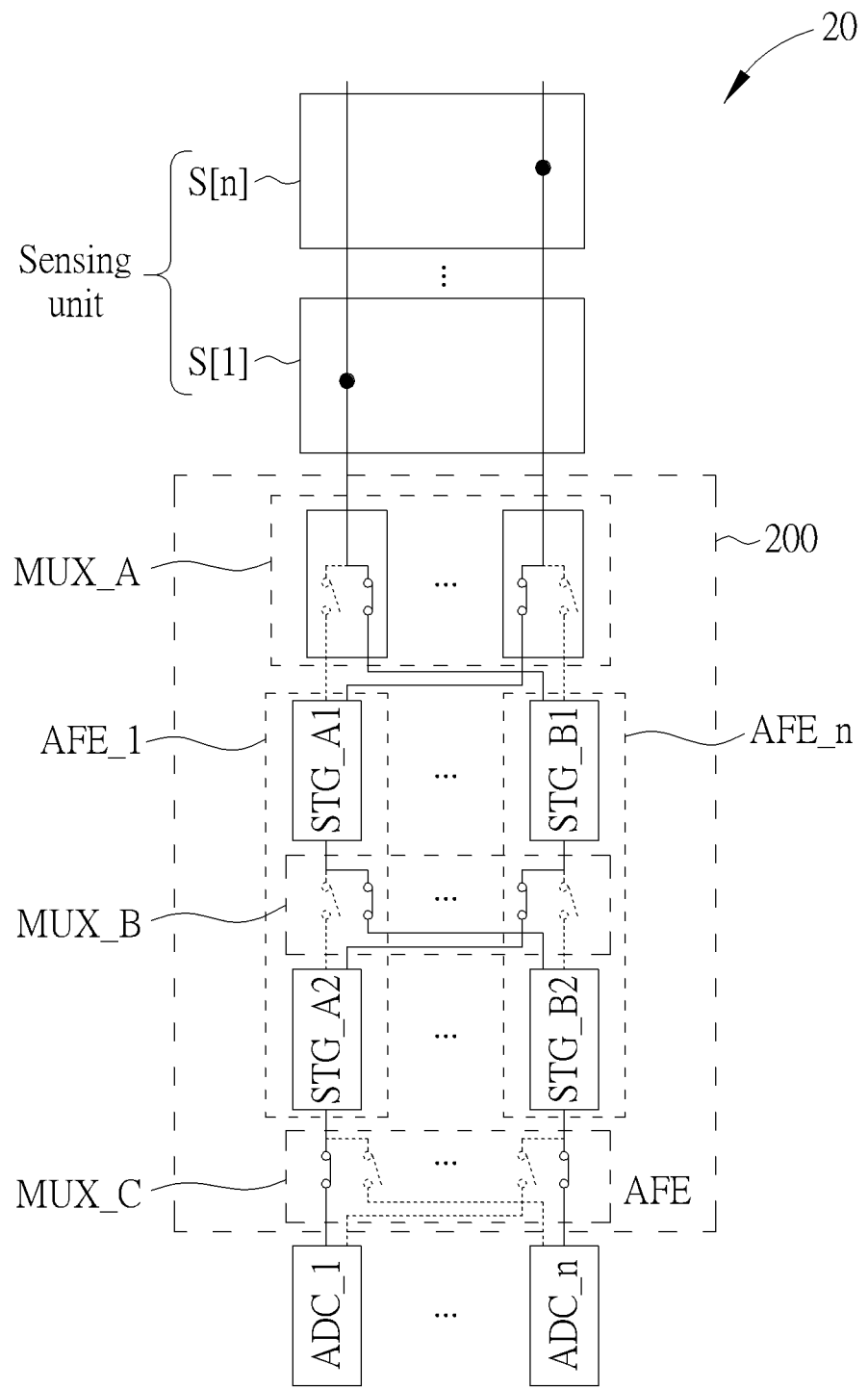

As shown in FIG. 4C, the MUX MUX_A is configured to couple the sensing unit S[1] to the first stage STG_B1 of the sensing circuit AFE_n and couple the sensing unit S[n] to the first stage STG_A1 of the sensing circuit AFE_1. The MUX MUX_B is configured to couple the first stage STG_B1 of the sensing circuit AFE_n to the second stage STG_A2 of the sensing circuit AFE_1 and couple the first stage STG_A1 of the sensing circuit AFE_1 to the second stage STG_B2 of the sensing circuit AFE_n. The MUX MUX_C is configured to couple the second stage STG_A2 of the sensing circuit AFE_1 to the ADC ADC_1 and couple the second stage STG_B2 of the sensing circuit AFE_n to the ADC ADC_n. In this configuration, the sensing signal from the sensing unit S[1] may be received and processed by the first stage STG_B1 of the sensing circuit AFE_n and the second stage STG_A2 of the sensing circuit AFE_1 and then output to the ADC ADC_1, and the sensing signal from the sensing unit S[n] may be received and processed by the first stage STG_A1 of the sensing circuit AFE_1 and the second stage STG_B2 of the sensing circuit AFE_n and then output to the ADC ADC_n.

Figure 4D:
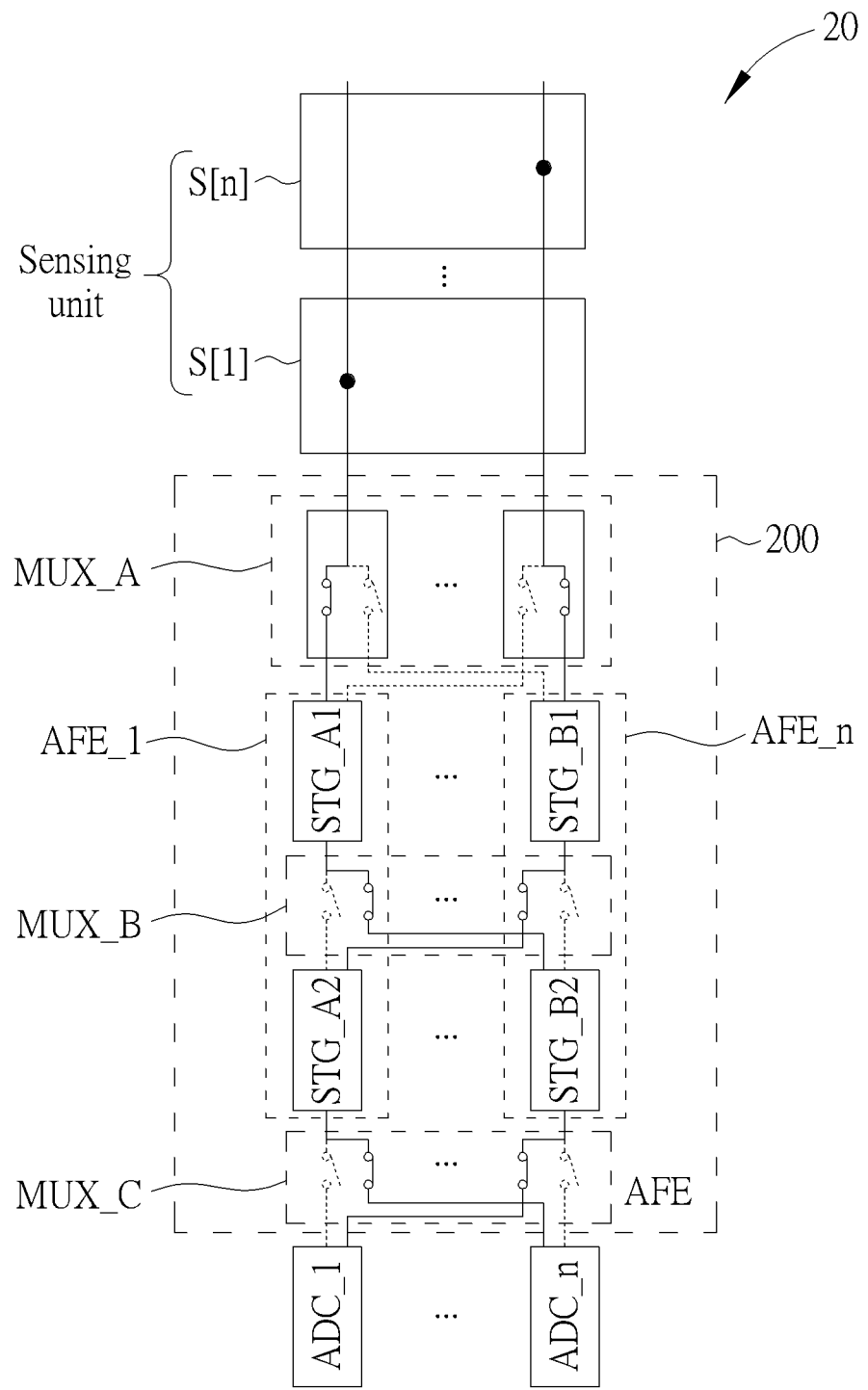

As shown in FIG. 4D, the MUX MUX_A is configured to couple the sensing unit S[1] to the first stage STG_A1 of the sensing circuit AFE_1 and couple the sensing unit S[n] to the first stage STG_B1 of the sensing circuit AFE_n. The MUX MUX_B is configured to couple the first stage STG_A1 of the sensing circuit AFE_1 to the second stage STG_B2 of the sensing circuit AFE_n and couple the first stage STG_B1 of the sensing circuit AFE_n to the second stage STG_A2 of the sensing circuit AFE_1. The MUX MUX_C is configured to couple the second stage STG_B2 of the sensing circuit AFE_n to the ADC ADC_1 and couple the second stage STG_A2 of the sensing circuit AFE_1 to the ADC ADC_n. In this configuration, the sensing signal from the sensing unit S[1] may be received and processed by the first stage STG_A1 of the sensing circuit AFE_1 and the second stage STG_B2 of the sensing circuit AFE_n and then output to the ADC ADC_1, and the sensing signal from the sensing unit S[n] may be received and processed by the first stage STG_B1 of the sensing circuit AFE_n and the second stage STG_A2 of the sensing circuit AFE_1 and then output to the ADC ADC_n.

In an embodiment, the configurations of MUXs as shown in FIGS. 4A and 4C may be implemented alternately. For example, the MUX configuration shown in FIG. 4A may be applied in the odd time slots T_1, T_3 . . . , and T (x-1), and the MUX configuration shown in FIG. 4C may be applied in the even time slots T_2, T_4 . . . , and T_x. Alternatively, the configurations of MUXs as shown in FIGS. 4A and 4D may be implemented alternately. For example, the MUX configuration shown in FIG. 4A may be applied in the odd time slots T_1, T_3 . . . , and T (x-1), and the MUX configuration shown in FIG. 4D may be applied in the even time slots T_2, T_4 . . . , and T_x. In an additional embodiment, the MUX configurations shown in FIG. 4A-4D may be arranged in any appropriate manner, in order to further disperse the offset values of each sensing circuit and its circuit stage. For example, the time slots T_1-T_x in the sensing time may be classified into 4 groups, and each MUX configuration of FIGS. 4A-4D may be used in the time slots of one of the 4 groups, respectively.

Please note that the sensing signals usually need to be processed in the digital processing circuit behind the ADC. For example, the sensing signals from the same sensing unit may be averaged in the digital domain to generate the final sensing result. If the sensing signals from the same sensing unit are converted through different ADCs, the digital processing circuit should know the information that the sensing signal of which sensing unit is received from which ADC. Therefore, the digital processing circuit should be coupled to a memory or include a storage unit capable of storing the received data, and perform complex logic computation to rearrange the received data, in order to facilitate the calculations for the sensing signals. Preferably, in order to reduce the burden of the digital processing circuit, the MUXs of the AFE circuit may be configured in an appropriate manner so that a sensing unit is always coupled to the same ADC in every configuration, and the sensing signals from this sensing unit are always output to the same ADC.

Therefore, regardless of the switching configurations of the MUXs MUX_A, MUX_B and MUX_C, the sensing unit may be configured to be coupled to the same ADC through different sensing circuits and/or different circuit stages in different time slots. For example, in the embodiments shown in FIGS. 4A-4D, the sensing signals from the sensing unit S[1] are always output to the ADC ADC_1, and the sensing signals from the sensing unit S[n] are always output to the ADC ADC_n. This may be achieved by appropriately configuring the switching connections of the MUXs MUX_A, MUX_B and MUX_C in the AFE circuit 200.

In another embodiment, the AFE circuit 200 may include any number of MUXs. For example, only two of the MUXs MUX_A, MUX_B and MUX_C may be deployed in the AFE circuit, and the switching of the sensing circuits and/or circuit stages may be realized accordingly. In an alternative embodiment, there may be more than three MUXs implemented in the AFE circuit, for dividing each channel into more circuit stages, so as to further disperse the offset values of the sensing circuits.

In the above embodiment, the sensing circuit may be one or more circuit stages in a channel, and the MUXs are configured to switch the connections between different channels and/or circuit stages to reduce the overall offset. In other embodiments, the sensing circuit in the AFE circuit may be a module or block included in a circuit stage such as a gain amplifier, and the switching of the sensing circuits may be realized by using different configurations of the circuit elements in the gain amplifier.

For example, the gain amplifier may include multiple output elements, which are coupled to a plurality of switches. The output elements may be used to generate a gain under a configuration of the switches, where the configuration of the switches refers to the on/off statuses of the switches. According to the present invention, the same gain value may be realized by using different configurations of the switches to reduce the influences of the offset. In an embodiment, the output elements may be used to generate a first gain under a first configuration of the switches, and generate a second gain under a second configuration of the switches. The first gain may be equal to the second gain, while the first configuration is different from the second configuration; that is, at least one of the switches is turned on in the first configuration and turned off in the second configuration, and/or at least one of the switches is turned on in the second configuration and turned off in the first configuration.

Figure 5:
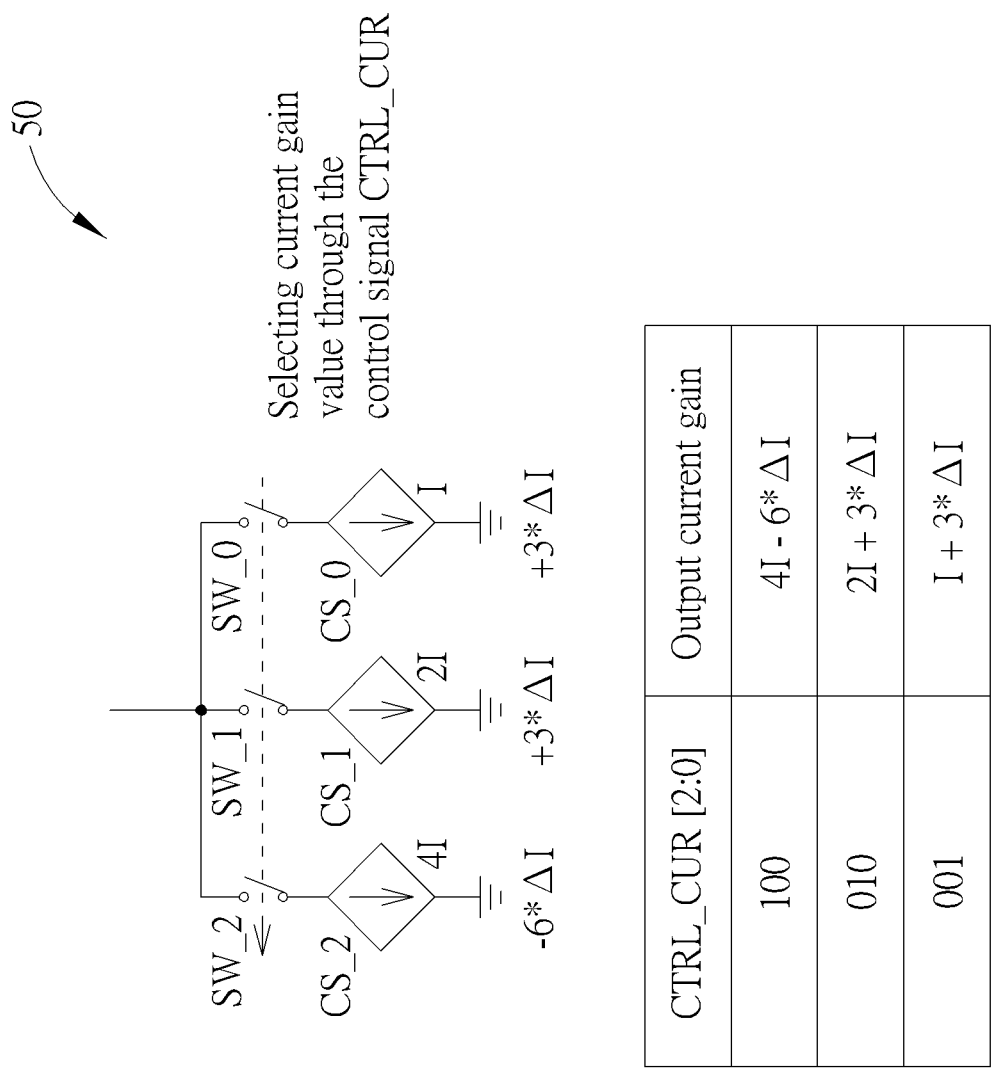
FIG. 5 is a schematic diagram of an amplification stage of a general current gain amplifier.

In an embodiment, the gain amplifier may be a current gain amplifier, and the output elements may be multiple current sources of the current gain amplifier. In general, the current gain amplifier may output an adjustable current gain by using multiple current sources having binary current values. Please refer to FIG. 5, which is a schematic diagram of an amplification stage of a general current gain amplifier 50, where the current gain is adjustable. As shown in FIG. 5, the current gain amplifier 50 includes 3 current sources CS_2, CS_1 and CS_0 and 3 switches SW_2, SW_1 and SW_0. The current source CS_2 is coupled to the switch SW_2, the current source CS_1 is coupled to the switch SW_1, and the current source CS_0 is coupled to the switch SW_0.

In detail, the current sources CS_2, CS_1 and CS_0 are configured with current values 4I, 2I and I, respectively, where I is a unit of current gain. The output current gain of the current gain amplifier 50 may be selected by controlling the switches SW_2, SW_1 and SW_0 to be on or off. For example, a 3-bit control signal CTRL CUR may be used to control the switches SW_2, SW_1 and SW_0 to determine the output current gain ranging from 0I to 7I. For example, if the control signal CTRL CUR is "100" indicating that the switch SW_2 is turned on and the switches SW_1 and SW_0 are turned off, the output current gain will be 4I. If the control signal CTRL CUR is "010" indicating that the switch SW_1 is turned on and the switches SW_2 and SW_0 are turned off, the output current gain will be 2I. If the control signal CTRL CUR is "001" indicating that the switch SW_0 is turned on and the switches SW_2 and SW_1 are turned off, the output current gain will be I.

However, the current sources of the current gain amplifier usually have offsets. In this example, the current source CS_2 has an offset value $-6\times\Delta I$, the current source CS_1 has an offset value $+3\times\Delta I$, and the current source CS_0 has an offset value $+3\times\Delta I$. Under the offset values, the output current gain may deviate from its accurate value. For example, as for the current gain amplifier 50, the actual output current gain will be $4I-6\times\Delta I$ if its expected output current gain is 4I, the actual output current gain will be $2I+3\times\Delta I$ if its expected output current gain is 2I, and the actual output current gain will be $I+3\times\Delta I$ if its expected output current gain is I. The offset value for each current source is fixed and cannot be easily canceled, especially when the current gain amplifier 50 is requested to generate a variable gain.

Figure 6:
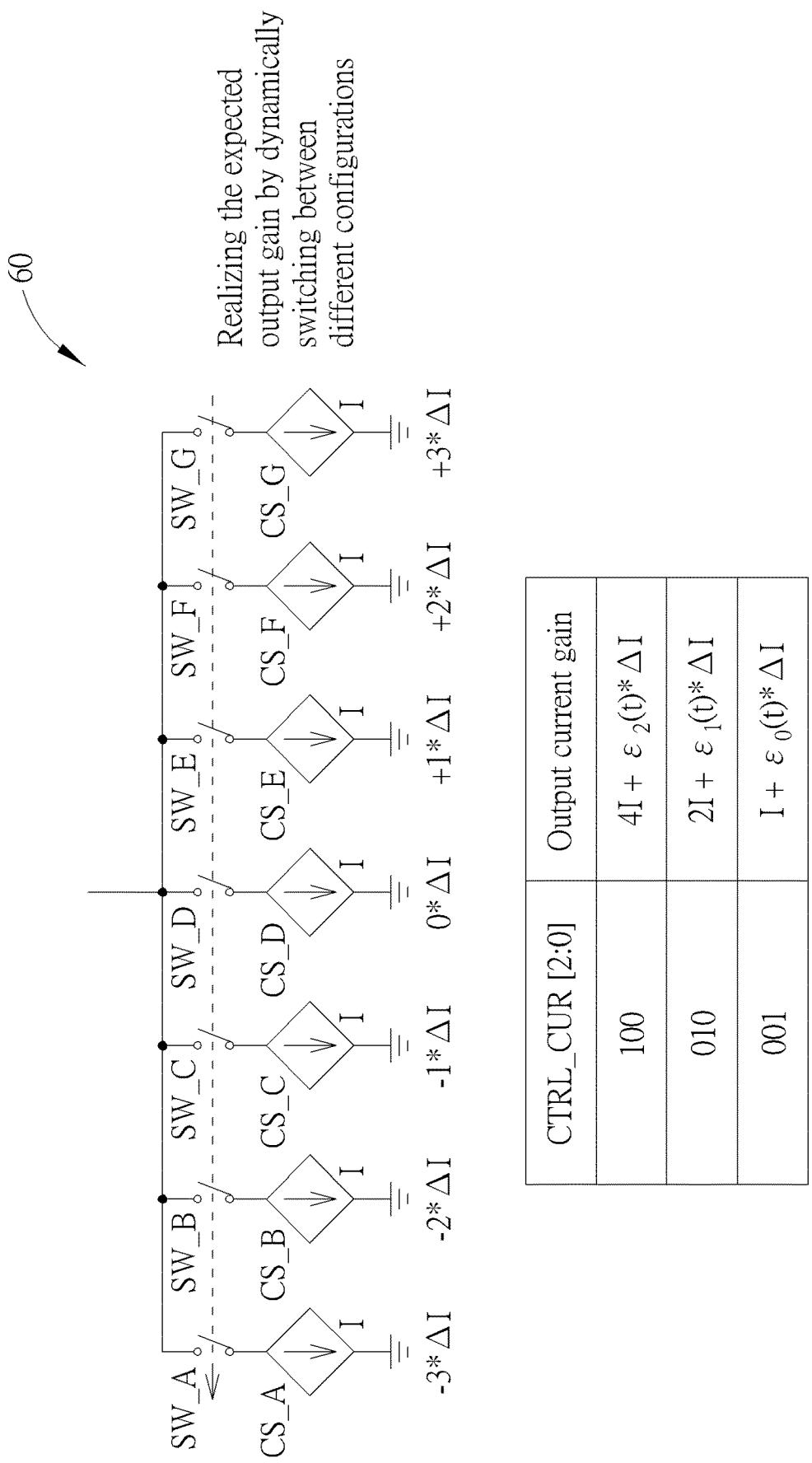
FIG. 6 is a schematic diagram of an amplification stage of a current gain amplifier according to an embodiment of the present invention.

The present invention provides a novel current gain amplifier capable of reducing or canceling the influences resulting from the offset of the current sources. Please refer to FIG. 6, which is a schematic diagram of an amplification stage of a current gain amplifier 60 according to an embodiment of the present invention. As shown in FIG. 6, the current gain amplifier 60 includes 7 current sources CS_A-CS_G and 7 switches SW_A-SW_G, where each current source CS_A-CS_G is coupled to one of the switches SW_A-SW_G in a one-to-one mapping. Each current source CS_A-CS_G may be a voltage-controlled current source (VCCS), but the implementations of the current sources are not limited thereto.

In detail, each current source CS_A-CS_G is configured with the same current gain I, but they may have different offset values caused by process mismatch and/or other matters. In this embodiment, it is supposed that the current sources CS_A-CS_G have offset values $-3\times\Delta I$, $-2\times\Delta I$, $-1\times\Delta I$, $0\times\Delta I$, $+1\times\Delta I$, $+2\times\Delta I$ and $+3\times\Delta I$, respectively. In this embodiment, the output current gain of the current gain amplifier 60 may also be controlled by a 3-bit control signal CTRL CUR.

In order to reduce the overall offset value resulting from the current sources CS_A-CS_G, the control signal CTRL CUR may control the configurations of the switches SW_A-SW_G to change dynamically. For example, if the current gain amplifier 60 needs to output the current gain 4I, the control signal CTRL CUR may turn on 4 switches among the switches SW_A-SW_G in different manners; that is, the switches SW_A-SW_G are controlled to be in various configurations to generate the output current gain 4I. In an exemplary embodiment, the switches SW_A, SW_B, SW_C and SW_D are turned on and other switches are turned off in the first configuration, and the switches SW_D, SW_E, SW_F and SW_G are turned on and other switches are turned off in the second configuration. Both of the configurations may achieve the output current gain 4I. If the current gain amplifier 60 needs to generate the output current gain 4I for a sensing signal during a sensing time, the switches SW_A-SW_G may be switched between the first configuration and the second configuration alternately in the sensing time. More specifically, the sensing time may be divided into multiple time slots, where the switches SW_A-SW_G may be in the first configuration in several time slots and in the second configuration in other time slots. Alternatively or additionally, the third, fourth or more configurations with 4 turned-on switches and 3 turn-off switches may be used. Therefore, under the implementations of the current gain amplifier 60 with multiple switchable configurations, the influences on the sensing signal resulting from the offsets of the current sources CS_A-CS_G may be reduced or canceled after dynamic switching between various configurations of the switches SW_A-SW_G for realizing the expected output gain of the current gain amplifier 60.

As shown in FIG. 6, due to the dynamic switching between different configurations of the switches SW_A-SW_G, the overall offset value may be a function of time; that is, the offset value may change between different time slots based on the selected current sources CS_A-CS_G in the time slots. For example, considering the offset values, the actual output current gain will be $4I+\varepsilon_2(t)\times\Delta I$ if the expected output current gain is 4I, the actual output current gain will be $2I+\varepsilon_1(t)\times\Delta I$ if the expected output current gain is 2I, and the actual output current gain will be $I+\varepsilon_0(t)\times\Delta I$ if the expected output current gain is I. The parameters $\varepsilon_2(t)$, $\varepsilon_1(t)$ and $\varepsilon_0(t)$ indicate the offset values as a function of time. The sensing signals with different offset values generated from different switch configurations may further be averaged, so as to reduce or cancel the influences resulting from the offset.

Figure 7:
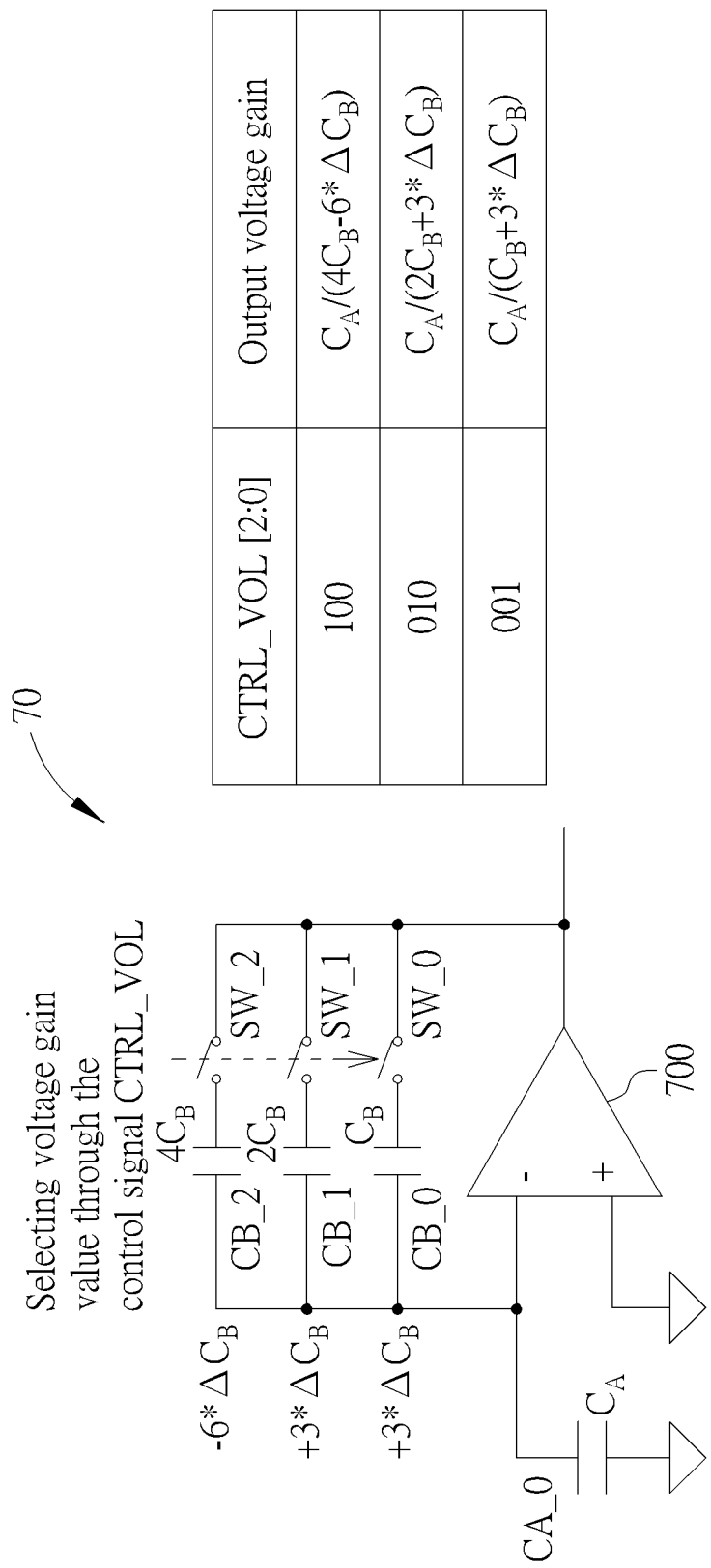
FIG. 7 is a schematic diagram of a general voltage gain amplifier.

In another embodiment, the gain amplifier may be a voltage gain amplifier, and the output elements may be multiple capacitors of the voltage gain amplifier. In general, the voltage gain amplifier may output an adjustable voltage gain by using multiple capacitors having binary capacitance values. Please refer to FIG. 7, which is a schematic diagram of a general voltage gain amplifier 70, where the voltage gain is adjustable. As shown in FIG. 7, the voltage gain amplifier 70 includes an operational amplifier 700, an input capacitor CA_0, 3 output capacitors CB_2, CB_1 and CB_0, and 3 switches SW_2, SW_1 and SW_0. The output capacitor CB_2 is coupled to the switch SW_2, the output capacitor CB_1 is coupled to the switch SW_1, and the output capacitor CB_0 is coupled to the switch SW_0.

In detail, the output capacitors CB_2, CB_1 and CB_0 are configured with capacitance values $4C_B$, $2C_B$ and $C_B$, respectively. The output voltage gain of the voltage gain amplifier 70 may be selected by controlling the switches SW_2, SW_1 and SW_0 to be on or off. For example, a 3-bit control signal CTRL_VOL may be used to control the switches SW_2, SW_1 and SW_0 to determine the output voltage gain between $C_A/C_B$ and $C_A/7C_B$. For example, if the control signal CTRL_VOL is "100" indicating that the switch SW_2 is turned on and the switches SW_1 and SW_0 are turned off, the output voltage gain will be $C_A/4C_B$. If the control signal CTRL_VOL is "010" indicating that the switch SW_1 is turned on and the switches SW_2 and SW_0 are turned off, the output voltage gain will be $C_A/2C_B$. If the control signal CTRL_VOL is "001" indicating that the switch SW_0 is turned on and the switches SW_2 and SW_1 are turned off, the output voltage gain will be $C_A/C_B$.

However, the capacitors of the voltage gain amplifier usually have offsets. In this example, the output capacitor CB_2 has an offset capacitance value $-6\times\Delta C_B$, the output capacitor CB_1 has an offset capacitance value $+3\times\Delta C_B$, and the output capacitor CB_0 has an offset capacitance value $+3\times\Delta C_B$. Under the offset capacitance values, the output voltage gain may deviate from its accurate value. For example, as for the voltage gain amplifier 70, the actual output voltage gain will be $C_A/(4C_B-6\times\Delta C_B)$ if its expected output voltage gain is $C_A/4C_B$, the actual output voltage gain will be $C_A/(2C_B+3\times\Delta C_B)$ if its expected output voltage gain is $C_A/2C_B$, and the actual output voltage gain will be $C_A/(C_B+3\times\Delta C_B)$ if its expected output voltage gain is $C_A/C_B$. The offset value for each capacitor is fixed and cannot be easily canceled, especially when the voltage gain amplifier 70 is requested to generate a variable gain.

Figure 8:
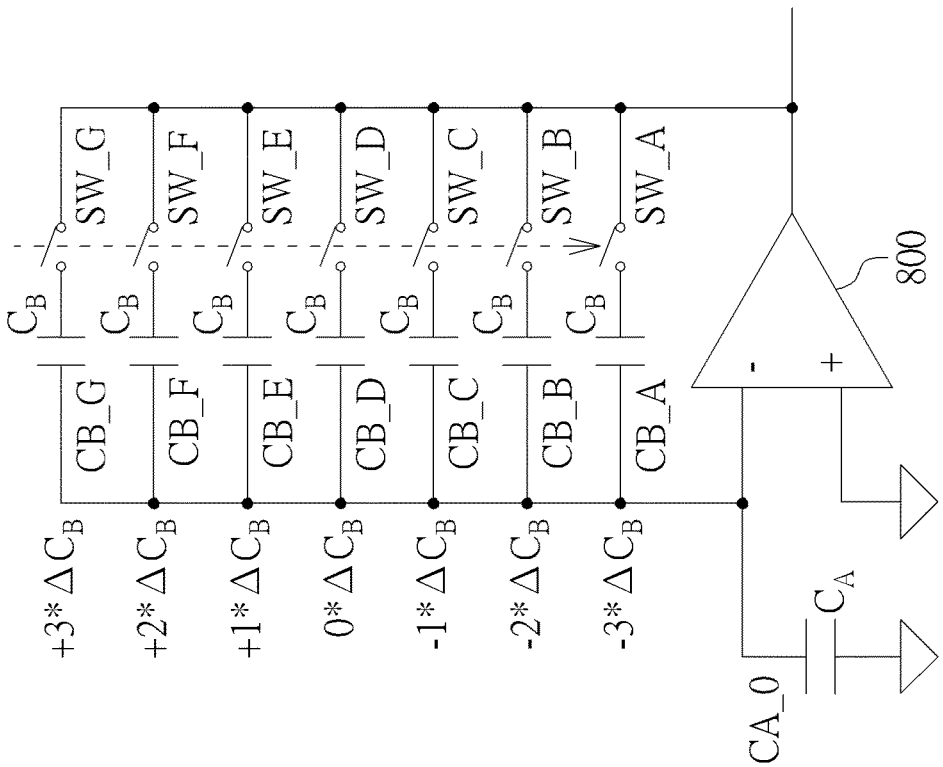
FIG. 8 is a schematic diagram of a voltage gain amplifier according to an embodiment of the present invention.

The present invention provides a novel voltage gain amplifier capable of reducing or canceling the influences resulting from the offset of the capacitors. Please refer to FIG. 8, which is a schematic diagram of a voltage gain amplifier 80 according to an embodiment of the present invention. As shown in FIG. 8, the voltage gain amplifier 80 includes an operational amplifier 800, an input capacitor CA_0, 7 output capacitors CB_A-CB_G, and 7 switches SW_A-SW_G, where each output capacitor CB_A-CB_G is coupled to one of the switches SW_A-SW_G in a one-to-one mapping.

In detail, each output capacitor CB_A-CB_G is configured with the same capacitance value CB, but they may have different offset values caused by process mismatch and/or other matters. In this embodiment, it is supposed that the output capacitors CB_A-CB_G have offset capacitance values $-3 \times \Delta C_B$, $-2 \times \Delta C_B$, $-1 \times \Delta C_B$, $0 \times \Delta C_B$, $+1 \times \Delta C_B$, $+2 \times \Delta C_B$ and $+3 \times \Delta C_B$, respectively. In this embodiment, the output voltage gain of the voltage gain amplifier 80 may also be controlled by a 3-bit control signal CTRL_VOL.

In order to reduce the overall offset value resulting from the output capacitors CB_A-CB_G, the control signal CTRL_VOL may control the configurations of the switches SW_A-SW_G to change dynamically. For example, if the voltage gain amplifier 80 needs to output the voltage gain $C_A/4C_B$, the control signal CTRL_VOL may turn on 4 switches among the switches SW_A-SW_G in different manners; that is, the switches SW_A-SW_G are controlled to be in various configurations to generate the output voltage gain $C_A/4C_B$. In an exemplary embodiment, the switches SW_A, SW_B, SW_C and SW_D are turned on and other switches are turned off in the first configuration, and the switches SW_D, SW_E, SW_F and SW_G are turned on and other switches are turned off in the second configuration. Both of the configurations may achieve the output voltage gain $C_A/4C_B$. If the voltage gain amplifier 80 needs to generate the output voltage gain $C_A/4C_B$ for a sensing signal during a sensing time, the switches SW_A-SW_G may be switched between the first configuration and the second configuration alternately in the sensing time. More specifically, the sensing time may be divided into multiple time slots, where the switches SW_A-SW_G may be in the first configuration in several time slots and in the second configuration in other time slots. Alternatively or additionally, the third, fourth or more configurations with 4 turned-on switches and 3 turn-off switches may be used. Therefore, under the implementations of the voltage gain amplifier 80 with multiple switchable configurations, the influences on the sensing signal resulting from the offsets of the output capacitors CB_A-CB_G may be reduced or canceled after dynamic switching between various configurations of the switches SW_A-SW_G for realizing the expected output gain of the voltage gain amplifier 80.

As shown in FIG. 8, due to the dynamic switching between different configurations of the switches SW_A-SW_G, the overall offset value may be a function of time; that is, the offset value may change between different time slots based on the selected output capacitors CB_A-CB_G in the time slots. For example, considering the offset values, the actual output voltage gain will be $C_A/(4C_B+\varepsilon_2(t) \times \Delta C_B)$ if the expected output voltage gain is $C_A/4C_B$, the actual output voltage gain will be $C_A/(2C_B+\varepsilon_1(t) \times \Delta C_B)$ if the expected output voltage gain is $C_A/2C_B$, and the actual output voltage gain will be $C_A/(C_B+\varepsilon_0(t) \times \Delta C_B)$ if the expected output voltage gain is $C_A/C_B$. The parameters $\varepsilon_2(t)$, $\varepsilon_1(t)$ and $\varepsilon_0(t)$ indicate the offset values as a function of time. The sensing signals with different offset values generated from different switch configurations may further be averaged, so as to reduce or cancel the influences resulting from the offset.

Please note that the implementations of variable gain are feasible in the sensing system of the present invention. The variable gain may be realized by using different voltage/current gain values in different time slots of a sensing time. For example, a gain amplifier such as the current gain amplifier or the voltage gain amplifier may provide a first gain, a second gain and a third gain in a first time slot, a second time slot and a third time slot, respectively. In a variable gain application, the first gain and the second gain may have different values, or the second gain and the third gain may have different values. In addition, supposing that the values of the first gain and the third gain are equal, the output elements of the gain amplifier may use different configurations to realize the identical gain value, to reduce the influences resulting from the offsets of the gain amplifier.

Figure 9:
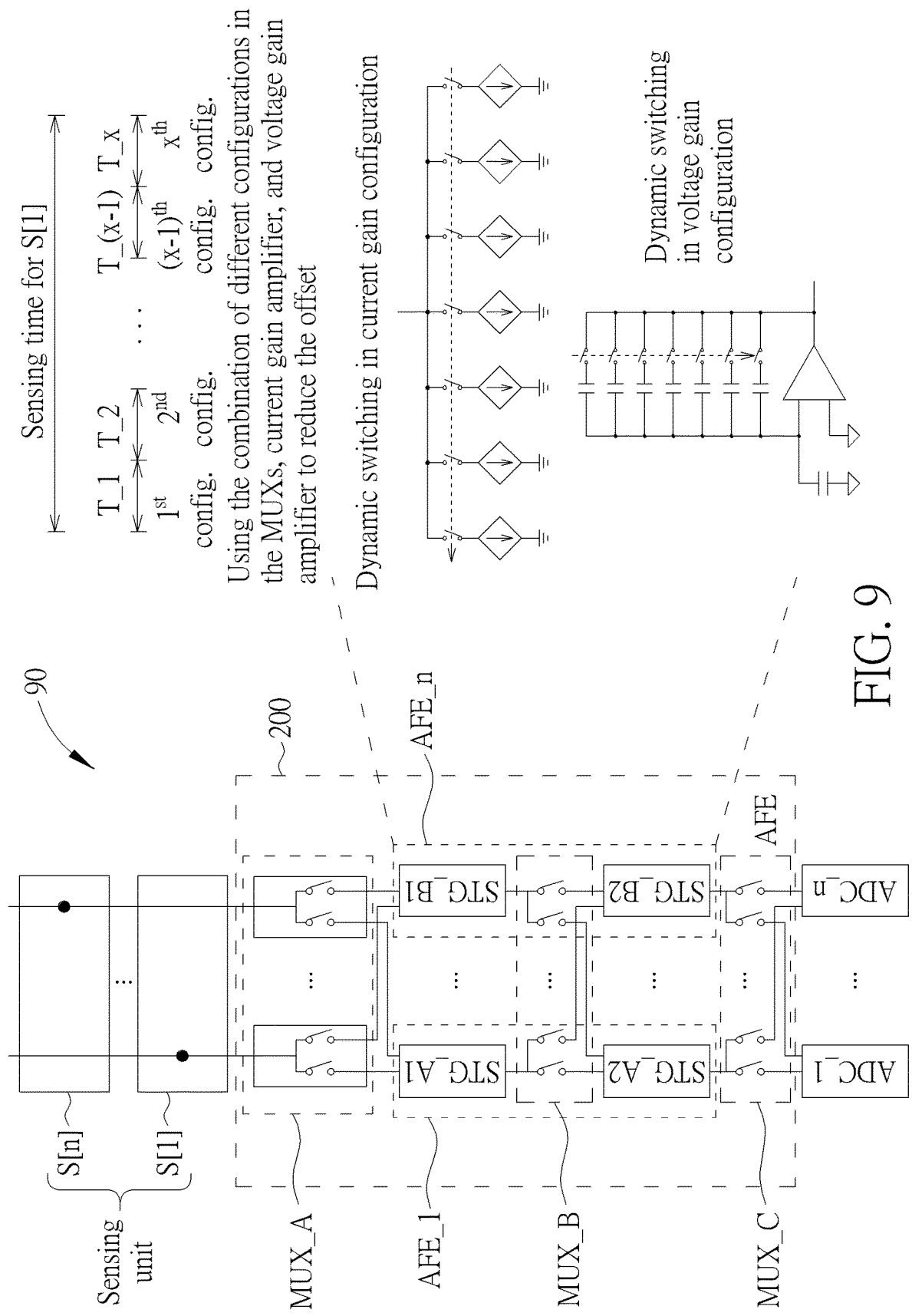
FIG. 9 is a schematic diagram of a sensing system according to an embodiment of the present invention.

Please refer to FIG. 9, which is a schematic diagram of a sensing system 90 according to an embodiment of the present invention. The structure of the sensing system 90 is similar to the structure of the sensing system 20, so signals and elements having similar functions are denoted by the same symbols. As shown in FIG. 9, the sensing system 90 further includes a current gain amplifier and a voltage gain amplifier having circuit structures similar to those shown in FIGS. 6 and 8, respectively. Each of the current gain amplifier and the voltage gain amplifier may be included in the first stage or the second stage of the sensing circuit in each channel.

In the sensing system 90, the sensing time for a sensing unit (e.g., S[1]) may be divided into x time slots T_1-T_x, and a specific configuration is applied in each time slot T_1-T_x. The specific configuration may be a combination of configurations of the MUXs MUX_A-MUX_C, the current sources in the current gain amplifier, and the output capacitors in the voltage gain amplifier. More specifically, in each of the time slots T_1-T_x, the MUXs MUX_A-MUX_C may be connected as an implementation shown in one of FIGS. 4A-4D, a designated number of switches in the current gain amplifier are turned on, and a designated number of switches in the voltage gain amplifier are turned on, to generate a predetermined gain value. All these configurations may dynamically change between different time slots, and thus the influences on the sensing signals resulting from the offset may be reduced or canceled after an average of the sensing signals received in multiple time slots.

Please note that the present invention aims at providing an AFE circuit for receiving sensing signals from a sensor where the configurations of the AFE circuit change dynamically to eliminate the influences of offset caused by process mismatch. Those skilled in the art may make modifications and alterations accordingly. For example, in the above embodiments, the sensing circuits in two channels may be alternately used to receive and process the sensing signals from a sensing unit. In another embodiment, three or more sensing circuits or channels may be dynamically used for the sensing signals from the same sensing unit, to further improve the stochasticity and dispersibility of the offset value.

It should also be noted that the embodiments of the present invention are applicable to realize not only a variable gain implementation but also a fixed gain implementation. Regardless of the values of the output gain, the alternate usage of different configurations in the AFE circuit may improve the accuracy of sensing signals by reducing the overall offset value generated from the sensing circuits.

To sum up, the present invention provides a novel AFE circuit for receiving and processing sensing signals of a sensor. As for a sensing signal received from a sensing unit, the AFE circuit may use different sensing circuits to receive the sensing signal in different time slots. In an embodiment, a MUX may be coupled between the sensing unit and multiple sensing circuits, to dynamically switch the sensing unit to be coupled to different sensing circuits. Therefore, the sensing signal may be received and processed by different sensing circuits. In such a situation, the influences on the sensing signal generated from the offset of the sensing circuit may be reduced or canceled after the sensing signals received from different sensing circuits are averaged. In another embodiment, the sensing circuit may include a gain amplifier with different configurations. In detail, the gain amplifier may include multiple output elements each coupled to a switch, and the output gain value may be determined by controlling the switch. Since each of the output elements may have an offset with different magnitudes, the gain amplifier may dynamically select different output elements to generate the expected output gain in different time slots. In such a situation, the influences on the sensing signal generated from the offset of the output elements may be reduced or canceled.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An analog front-end (AFE) circuit, configured to be coupled to a sensor having a plurality of sensing units, the AFE circuit comprising:
    a plurality of sensing circuits; and
    a plurality of multiplexers, each coupled between one of the plurality of sensing units and at least two of the plurality of sensing circuits;
    wherein each of the plurality of multiplexers comprises:
        a first switch, coupled between the one of the plurality of sensing units and a first sensing circuit among the at least two of the plurality of sensing circuits; and
        a second switch, coupled between the one of the plurality of sensing units and a second sensing circuit among the at least two of the plurality of sensing circuits.

2. The AFE circuit of claim 1, wherein each of the plurality of multiplexers is configured to selectively couple the one of the plurality of sensing units to one of the at least two of the plurality of sensing circuits.

3. The AFE circuit of claim 1, wherein the at least two of the plurality of sensing circuits comprises:
    a third sensing circuit, configured to be coupled to a first sensing unit among the plurality of sensing units in a first time slot; and
    a fourth sensing circuit, configured to be coupled to the first sensing unit in a second time slot different from the first time slot.

4. The AFE circuit of claim 3, wherein the third sensing circuit is configured to be coupled to a second sensing unit among the plurality of sensing units in the second time slot.

5. The AFE circuit of claim 4, wherein the fourth sensing circuit is configured to be coupled to the second sensing unit in the first time slot.

6. The AFE circuit of claim 1, wherein each of the plurality of sensing circuits comprises a circuit stage of the AFE circuit.

7. The AFE circuit of claim 1, wherein the plurality of sensing circuits comprise a first stage and a second stage of a first channel of the AFE circuit and a first stage and a second stage of a second channel of the AFE circuit, and the plurality of multiplexers comprise:
    a first multiplexer, coupled between a first sensing unit among the plurality of sensing units and the first stage of the first channel of the AFE circuit and the first stage of the second channel of the AFE circuit; and
    a second multiplexer, coupled between the first stage of the first channel of the AFE circuit, the first stage of the second channel of the AFE circuit, the second stage of the first channel of the AFE circuit, and the second stage of the second channel of the AFE circuit.

8. The AFE circuit of claim 1, wherein the AFE circuit is configured to be coupled to an analog-to-digital converter (ADC), and the plurality of multiplexers comprise:
    a first multiplexer, coupled between a first sensing unit among the plurality of sensing units and a fifth sensing circuit and a sixth sensing circuit among the plurality of sensing circuits; and
    a second multiplexer, coupled between the fifth sensing circuit, the sixth sensing circuit and the ADC;
    wherein the fifth sensing circuit is in a first channel of the AFE circuit, and the sixth sensing circuit is in a second channel of the AFE circuit, wherein the second channel is different from the first channel.

9. The AFE circuit of claim 8, wherein the first sensing unit is configured to be coupled to the fifth sensing circuit and the fifth sensing circuit is configured to be coupled to the ADC in a first time slot, and the first sensing unit is configured to be coupled to the sixth sensing circuit and the sixth sensing circuit is configured to be coupled to the ADC in a second time slot.

10. The AFE circuit of claim 1, wherein each of the plurality of sensing circuits comprises a plurality of output elements of a gain amplifier.

11. The AFE circuit of claim 10, wherein the plurality of output elements comprise a plurality of current sources or a plurality of capacitors coupled to a plurality of switches.

12. The AFE circuit of claim 1, wherein the AFE circuit is configured to receive a plurality of sensing signals from a first sensing unit among the plurality of sensing units through the at least two of the plurality of sensing circuits, respectively.

13. The AFE circuit of claim 12, wherein the plurality of sensing signals received through the at least two of the plurality of sensing circuits are averaged to generate a sensing result corresponding to the first sensing unit.

14. An analog front-end (AFE) circuit, configured to be coupled to a sensor having a plurality of sensing units, the AFE circuit comprising:
    a plurality of sensing circuits; and
    a plurality of multiplexers, each coupled between one of the plurality of sensing units and at least two of the plurality of sensing circuits;
    wherein the AFE circuit is configured to receive a plurality of sensing signals from a first sensing unit among the plurality of sensing units through the at least two of the plurality of sensing circuits, respectively, and the plurality of sensing signals are combined to generate a sensing result corresponding to the first sensing unit.

15. The AFE circuit of claim 14, wherein the plurality of sensing signals received through the at least two of the plurality of sensing circuits are averaged to generate the sensing result corresponding to the first sensing unit.

* * * * *